United States Patent
Sandhu (10) Patent No.: US 9,502,642 B2
(45) Date of Patent: Nov. 22, 2016

(54) MAGNETIC TUNNEL JUNCTIONS, METHODS USED WHILE FORMING MAGNETIC TUNNEL JUNCTIONS, AND METHODS OF FORMING MAGNETIC TUNNEL JUNCTIONS

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/684,110

(22) Filed: Apr. 10, 2015

(65) Prior Publication Data

US 2016/0301001 A1   Oct. 13, 2016

(51) Int. Cl.
| | |
|---|---|
| *H01L 43/10* | (2006.01) |
| *H01L 43/02* | (2006.01) |
| *H01L 43/08* | (2006.01) |
| *H01L 43/12* | (2006.01) |

(52) U.S. Cl.
CPC ............ *H01L 43/10* (2013.01); *H01L 43/02* (2013.01); *H01L 43/08* (2013.01); *H01L 43/12* (2013.01)

(58) Field of Classification Search
CPC ......... G11B 5/33; H01L 43/02; H01L 43/08; H01L 43/10; H01L 43/12; G11C 11/161
USPC ........................................ 257/421
See application file for complete search history.

(56) References Cited

U.S. PATENT DOCUMENTS

| | | | | |
|---|---|---|---|---|
| 5,640,343 | A | | 6/1997 | Gallagher et al. |
| 5,898,548 | A | * | 4/1999 | Dill .................. G11B 5/332 360/319 |
| 5,949,600 | A | * | 9/1999 | Akiyama ............ B82Y 10/00 360/55 |
| 5,994,899 | A | * | 11/1999 | Mohri ................ G01R 33/02 324/117 R |
| 6,034,882 | A | | 3/2000 | Johnson et al. |
| 6,048,632 | A | * | 4/2000 | Solin ................. B82Y 10/00 324/252 |
| 6,600,184 | B1 | | 7/2003 | Gill |
| 6,603,677 | B2 | | 8/2003 | Redon et al. |

(Continued)

FOREIGN PATENT DOCUMENTS

| | | |
|---|---|---|
| CN | 1339159 | 3/2002 |
| EP | 11845727.4 | 11/2014 |

(Continued)

OTHER PUBLICATIONS

U.S. Appl. No. 14/704,023, filed May 5, 2015, Siddik.

(Continued)

*Primary Examiner* — Nathan Ha
(74) *Attorney, Agent, or Firm* — Wells St. John, P.S.

(57) ABSTRACT

A method used while forming a magnetic tunnel junction comprises forming non-magnetic tunnel insulator material over magnetic electrode material. The tunnel insulator material comprises MgO and the magnetic electrode material comprises Co and Fe. B is proximate opposing facing surfaces of the tunnel insulator material and the magnetic electrode material. B-absorbing material is formed over a sidewall of at least one of the magnetic electrode material and the tunnel insulator material. B is absorbed from proximate the opposing facing surfaces laterally into the B-absorbing material. Other embodiments are disclosed, including magnetic tunnel junctions independent of method of manufacture.

14 Claims, 3 Drawing Sheets

(56) References Cited

U.S. PATENT DOCUMENTS

| | | |
|---|---|---|
| 6,788,502 B1 | 9/2004 | Gill |
| 7,009,278 B2 | 3/2006 | Hsu |
| 7,233,024 B2 | 6/2007 | Scheuerlein et al. |
| 7,595,520 B2 | 9/2009 | Horng et al. |
| 7,629,637 B2 | 12/2009 | Kajiyama et al. |
| 7,660,153 B2 | 2/2010 | Yamane et al. |
| 7,755,076 B2 | 7/2010 | Lung |
| 7,944,738 B2 | 5/2011 | Liu et al. |
| 7,983,065 B2 | 7/2011 | Samachisa |
| 8,098,520 B2 | 1/2012 | Seigler et al. |
| 8,102,700 B2 | 1/2012 | Liu et al. |
| 8,124,968 B2 | 2/2012 | Koo et al. |
| 8,218,357 B2 | 7/2012 | Liu et al. |
| 8,310,861 B2 | 11/2012 | Liu et al. |
| 8,338,224 B2 | 12/2012 | Yoon et al. |
| 8,431,458 B2 | 4/2013 | Sills et al. |
| 8,536,556 B2 | 9/2013 | Fukumizu |
| 8,553,450 B2 | 10/2013 | Keiji et al. |
| 8,559,141 B1 | 10/2013 | Pakala |
| 8,609,439 B2 | 12/2013 | Prejbeanu et al. |
| 8,836,056 B2 | 9/2014 | Oguz et al. |
| 8,842,465 B2 | 9/2014 | Yamane et al. |
| 9,099,124 B1 | 8/2015 | Freitag |
| 9,177,573 B1 | 11/2015 | Oh |
| 2002/0018355 A1 | 2/2002 | Johnson et al. |
| 2002/0079524 A1 | 6/2002 | Dennison |
| 2004/0057295 A1 | 3/2004 | Matsukawa et al. |
| 2005/0006682 A1 | 1/2005 | Bae et al. |
| 2005/0174835 A1 | 8/2005 | Rinerson et al. |
| 2005/0247964 A1 | 11/2005 | Pietambaram et al. |
| 2005/0254289 A1 | 11/2005 | Nakajima et al. |
| 2007/0096229 A1 | 5/2007 | Yoshikawa |
| 2007/0243638 A1 | 10/2007 | Horng et al. |
| 2008/0144234 A1 | 6/2008 | Lin |
| 2009/0261314 A1 | 10/2009 | Kim et al. |
| 2009/0261343 A1 | 10/2009 | Herner et al. |
| 2009/0323385 A1 | 12/2009 | Scheuerlein et al. |
| 2010/0135061 A1 | 6/2010 | Li et al. |
| 2010/0157657 A1 | 6/2010 | Rinerson et al. |
| 2010/0259962 A1 | 10/2010 | Yan et al. |
| 2011/0062538 A1 | 3/2011 | Rizzo et al. |
| 2011/0149646 A1 | 6/2011 | Liu et al. |
| 2011/0309322 A1 | 12/2011 | Hwang |
| 2011/0318848 A1 | 12/2011 | Choi |
| 2012/0056285 A1 | 3/2012 | Bessho et al. |
| 2012/0068139 A1 | 3/2012 | Daibou |
| 2012/0087179 A1 | 4/2012 | Jung |
| 2012/0127603 A1 | 5/2012 | Gao |
| 2012/0193216 A1 | 8/2012 | Endo |
| 2013/0037862 A1 | 2/2013 | Kitagawa et al. |
| 2013/0071954 A1 | 3/2013 | Zhou |
| 2013/0148418 A1 | 6/2013 | Luo et al. |
| 2013/0177781 A1 | 7/2013 | Chepulskyy et al. |
| 2013/0181305 A1 | 7/2013 | Nakayama et al. |
| 2013/0224521 A1 | 8/2013 | Wang et al. |
| 2013/0236639 A1 | 9/2013 | Carey |
| 2013/0241015 A1 | 9/2013 | Nomachi |
| 2013/0307097 A1 | 11/2013 | Yi et al. |
| 2014/0027869 A1 | 1/2014 | Lee et al. |
| 2014/0038314 A1 | 2/2014 | Zhou |
| 2014/0084401 A1 | 3/2014 | Kato |
| 2014/0117477 A1 | 5/2014 | Park et al. |
| 2014/0131649 A1 | 5/2014 | Daibou et al. |
| 2014/0145792 A1 | 5/2014 | Wang et al. |
| 2014/0175581 A1 | 6/2014 | Guo |
| 2014/0248719 A1 | 9/2014 | Zhou et al. |
| 2014/0269033 A1 | 9/2014 | Natori et al. |
| 2014/0284742 A1 | 9/2014 | Sawada et al. |
| 2015/0069562 A1 | 3/2015 | Sandhu |
| 2015/0137289 A1 | 5/2015 | Khalili Amiri |
| 2015/0280113 A1 | 10/2015 | Tan |

FOREIGN PATENT DOCUMENTS

| | | |
|---|---|---|
| JP | 2008-034857 | 2/2008 |
| JP | 2009-267411 | 11/2009 |
| JP | 2010-010688 | 1/2010 |
| JP | 2010-034153 | 2/2010 |
| JP | 2010-232214 | 10/2010 |
| JP | 2010-263211 | 11/2010 |
| JP | 2012-523647 | 6/2013 |
| JP | 2013-140891 | 7/2013 |
| KR | 10-2008-0084590 | 9/2008 |
| KR | 2010-0083402 | 7/2010 |
| KR | 10-2015-0031311 | 3/2015 |
| WO | WO 2010/101340 | 9/2010 |
| WO | WO PCT/US2011/059095 | 5/2012 |
| WO | WO PCT/US2011/059095 | 6/2013 |
| WO | WO PCT/US2014/047572 | 10/2014 |
| WO | WO PCT/US2015/061568 | 2/2016 |
| WO | WO PCT/US2014/047572 | 3/2016 |
| WO | WO PCT/2015/018015 | 6/2016 |
| WO | WO PCT/2016/018015 | 6/2016 |
| WO | WO PCT/2016/024219 | 7/2016 |

OTHER PUBLICATIONS

U.S. Appl. No. 14/228,104, filed Mar. 27, 2014, Micron Technology, Inc.
U.S. Appl. No. 14/687,280, filed Apr. 15, 2015, Siddik et al.
U.S. Appl. No. 14/687,317, filed Apr. 15, 2015, Siddik.
U.S. Appl. No. 14/690,803, filed Apr. 20, 2015, Hineman.
U.S. Appl. No. 14/706,182, filed May 7, 2015, Harms et al.
Bai et al.; Boron diffusion induced symmetry reduction and scattering in CoFeB/MgO/CoFeB magnetic tunnel junctions; Physical Review B 87; Jan. 23, 2013; pp. 014114-1-014114-6.
Banderia et al.; Comparison of Synthethic Antiferromagnets and Hard Ferromagnets as Reference Layer in Magnetic Tunnel Junctions With Perpendicular Magnetic Anisotropy; IEEE Magnetics Letters, vol. 1; Jul. 8, 2010; 4 pp.
Bouchikhaoui et al.; On the role of Ta cap in the recrystallization process of CoFeB layers; Applied Physics Letters 103; Oct. 3, 2013; pp. 14212-1-14212-5.
Brataas et al.; Spin Pumping and Spin Transfer; Condensed Matter > Mesoscale and Nanoscale Physics; Cornell University; Mar. 6, 2012; pp. 1-30.
Burton et al.; Atomic and Electronic Structure of the Co Fe B MgO Interface From First Principles; Applied Physics Letters 89; Oct. 5, 2006; pp. 142507-1142507-3.
Butler et al.; Spin-dependent tunneling conductance of Fe/MgO/Fe sandwiches; Physical Review B, vol. 63; Jan. 8, 2000; pp. 054416-1-054416-12.
Conca et al.; Annealing influence on the Gilbert damping parameter and the exchange constant of CoFeB thin films; Applied Physics Letters 104; May 8, 2014; pp. 182407-1-182407-4.
Devolder et al.; Damping of CoxFe80-xB20 ultrathin films with perpendicular magnetic anisotropy; Applied Physics Letters 102; Jan. 15, 2013; pp. 022407-1-022407-4.
Feng et al.; Annealing of CoFeB/MgO Based Single and Double Barrier Magnetic Tunnel Junctions: Tunnel Magnetoresistance, Bias Dependence, and Output Voltage; Journal of Applied Physics 105; Feb. 11, 2009; pp. 033916-1-033916-7.
Hopp et al.; Chemical Composition and Iron Oxidation State of the Amorphous Silicate Matrix in Acfer 094; 46th Lunar and Planetary Science Conference; Jan. 27, 2015; 2 pp.
Jang et al.; Variation in the properties of the interface in a CoFeB/MgO/CoFeB tunnel junction during thermal anealing; Applied Physics Letters 91; Sep. 4, 2007; pp. 102104-1-102104-3.

(56) References Cited

OTHER PUBLICATIONS

Jiang et al.; Sputtered FeCoN soft magnetic thin films with high resistivity; IEEE Transactions on Magnetics, vol. 39, No. 6; Nov. 2003; pp. 3559-3562.

Kuo et al.; Microstructure and magnetic properties of FeCoN thin films; Journal of Applied Physics vol. 83, No. 11; Jun. 1, 1998; pp. 6643-6645.

Kurt et al.; Boron diffusion in magnetic tunnel junctions with MgO (001) barriers and CoFeB electrodes; Applied Physics Letters 96; Jun. 28, 2010; pp. 262501-1-262501-3.

Liu et al.; Ferromagnetic resonance and damping properties of CoFeB thin films as free layers in MgO-based magnetic tunnel junctions; Journal of Applied Physics 110; Aug. 8, 2011; pp. 033910-1-033910-5.

Mathon et al.; Theory of tunneling magnetoresistance of an epitaxial FeO/MgO/Fe(?001)? junction; Physical Review B, vol. 63; May 10, 2001; pp. 220403-1-220403-4.

Mizunuma et al.; MgO barrier-perpendicular magnetic tunnel junctions with CoFe/Pd multilayers and ferromagnetic insertion layers; Applied Physics Letters; Dec. 11, 2009; 17 pp.

Munira et al.; Comparative material issues for fast reliable switching in STT-RAMs; 2011 11th IEEE International Conference on Nanotechnology; Aug. 15-18, 2011; pp. 1403-1408.

Parkin et al.; Giant tunnelling magnetoresistance at room temperature with MgO (100) tunnel barriers; Nature Materials, vol. 3; Dec. 31, 2004; pp. 862-867.

Rickart et al.; Exchange coupling of bilayers and synthetic antiferromagnets pinned to MnPt; The European Physics Journal B; Jan. 8, 2005; pp. 1-6.

Rumaiz et al.; Boron migration due to annealing in CoFeB/MgO/CoFeB interfaces: A combined hard x-ray photoelectron spectroscopy and x-ray absorption studies; Applied Physics Letters 99; Nov. 28, 2011; pp. 222502-1-222502-3.

Sun et al.; Effect of Subvolume Excitation and Spin-Torque Efficiency on Magnetic Switching; Physical Review B-84; Aug. 19, 2011; pp. 064413-1-064413-9.

Tsunoda et al.; A Novel MTJ for STT-MRAM With a Dummy Free Layer and Dual Tunnel Junctions; Electron Device Meeting; Dec. 10-13, 2012; pp. 29.1.1-29.1.4.

You et al.; Boron segregation in crystallized MgO/amorphous-Co40Fe40B20 thin films; Journal of Applied Physics 104; Aug. 5, 2008; pp. 033517-1-033517-6.

Zhang et al.; Large magnetoresistance in bcc Co/MgO/Co and FeCo/MgO/FeCo tunnel junctions;.Physical Review B 70; Nov. 17, 2004; pp. 172407-1-172407-4.

U.S. Appl. No. 14/563,303, filed Dec. 8, 2014, Chen et al.

Annealing influence on the Gilbert damping parameter and the exchange constant of CoFeB thin films; Conca te al.; Applied Physics Letter 104; May 8, 2014; pp. 182407-1-182401-4.

Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.

Atomic and Electronic Structure of CoFeb/MgO Interface from First Principles; Burton et al.; Applied Physics Letters, vol. 89; Oct. 5, 2006; pp. 142507-1 to 142507-3.

Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.

Boron diffusion induced symmetry reduction and scattering in CoFeB/MgO/CoFeB Magnetic tunnel junctions; Bai et al.; The American Physical Society; Physical Review B, vol. 87; Jan. 23, 2013; pp. 014114-1 to 014114-6.

Boron migration due to annealing in CoFeB/MgO/CoFeB interfaces: A combined hard x-ray photoelectron spectroscopy and x-ray absorption studies; Rumaiz et al.; Applied Physics Letters, vol. 99; Nov. 28, 2011; pp. 222502-1 to 222502-3.

Boron segregation in crystallized MgO/amorphous-Co 40 Fe 40 B 20 Co 40 Fe 40 B 20 Co 40 Fe 40 B 20 thin films; You et al.; Journal of Applied Physics, vol. 104, Aug. 5, 2008; pp. 033517-1 to 033517-6.

Comparative material issues for fast reliable switching in STT-RAMs; Munira et al.; 2011 11th IEEE International Conference on Nanotechnology; Aug. 15-18, 2012; pp. 1403-1408.

Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.

Damping of Cox-Fe80-xB20 ultrathin films with perendicular magnetic anisotropy; Devolder et al.; Applied Physics Letters 102; Jan. 15, 2013; pp. 022407-1-022407-4.

Exchange coupling of bilayers and synthetic antiferromagnets pinned to MnPt; Rickart et al.; The European Physical Journal B; Mar. 8, 2005; pp. 1-6.

Giant tunnelling magnetoresistance at room temperature with MgO (100) tunnel barriers; Parkin et al.; nature materials, vol. 3; Oct. 31, 2004; pp. 862-867.

Magnetic Tunnel Junctions; Zhu et al.; Materialstoday; vol. 9, No. 11; Nov. 2006; pp. 36-45.

Magnetoresistive Random-Access Memory; www.wikipedia.org/wiki/RAM; As downloaded from the Internet Jul. 28, 2013; 10 pp.

MgO barrier-perpendicular magnetic tunnel junctions with CoFe/Pd multilayers and ferromagnetic insertion layers; Mizunuma et al.; Laboratory for Nanoelectronics and Spintronics, Research Institute of Dec. 11, 2009; 17 pp.

Microstructure and magnetic properties of FeCoN thin films; Kuo et al.; Journal of Applied Physics, vol. 83, No. 11; Jun. 1, 1998; pp. 6643-6645.

On the role of Ta cap in the recrystallization process of CoFeB layers; Bouchikhaoui et al.; Applied Physics Letters, vol. 103; Oct. 3, 2013; pp. 142412-1 to 142412-5.

Spin Pumping and Spin Transfer; Brataas et al.; arXiv:1108.0385v3[cond-ma.tmes-hall]; Mar. 6, 2012; pp. 1-30.

Spin-dependent tunneling conductance of FezMgOzFe sandwiches; Butler et al.; The American Physical.Society; Physical Review B, vol. 63; Jan. 8, 2001; pp. 054416-1 to 054416-12.

Spin-Transfer Torque; www.wikipedia.org/wiki/Spin-transfer_torque; As downloaded from the Internet Aug. 2, 2013; 2 pp.

Sputtered FeCoN Soft Magnetic Thin Films With High Resistivity; Jiang et al.; IEEE Transactions on Magnetics, vol. 39, No. 6; Nov. 2003; pp. 3559-3562.

Status and Challenges for Non-Volatile Spin-Transfer Torque RAM (STT-RAM); Krounbi et al.; International Symposium on Advanced Gate Stack-Technology; Sep. 23, 2010; 28 pp.

Theory of tunneling magnetoresistance of an epitaxial FeÔMgOÔFe/001 junction; Manthan et al.; The American Physical Society; Physical Review B, vol. 63; May 10, 2001; pp. 220403-1 to 220403-4.

Tunnel Magnetoresistance; www.wikipedia.org/wiki/tunnel_manetoresistance; As downloaded from the Internet Jul. 28, 2013; 5 pp.

Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.

Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.

* cited by examiner

MAGNETIC TUNNEL JUNCTIONS, METHODS USED WHILE FORMING MAGNETIC TUNNEL JUNCTIONS, AND METHODS OF FORMING MAGNETIC TUNNEL JUNCTIONS

TECHNICAL FIELD

Embodiments disclosed herein pertain to magnetic tunnel junctions, to methods used while forming magnetic tunnel junctions, and to methods of forming magnetic tunnel junctions.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. The resistance of current flow between those two nodes through the reference electrode, insulator material, and the recording electrode is dependent upon the overall magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

An alloy or other mixture of Co and Fe is one common material proposed for use as a polarizer material and/or as at least part of the magnetic recording material of a recording electrode in a magnetic tunnel junction. A more specific example is $Co_xFe_yB_z$ where x and y are each 10-80 and z is 0-50, and may be abbreviated as CoFe or CoFeB. MgO is an ideal material for the non-magnetic tunnel insulator. Ideally such materials are each crystalline having a body-centered-cubic (bcc) 001 lattice. Such materials may be deposited using any suitable technique, for example by physical vapor deposition. One technique usable to ultimately produce the bcc 001 lattice in such materials includes initially forming CoFe to be amorphous and upon which MgO-comprising tunnel insulator material is deposited. During and/or after the depositing, the MgO tunnel insulator, the CoFe, and the tunnel insulator ideally individually achieve a uniform bcc 001 lattice structure.

Boron is commonly deposited as part of the CoFe to assure or provide initial amorphous deposition of the CoFe. Crystallization of the CoFe can occur during or after deposition of the MgO by annealing the substrate at a temperature of at least about 350° C. This will induce the diffusion of B atoms out of the CoFe matrix being formed to allow crystallization into bcc 001 CoFe. Bcc 001 MgO acts as a template during the crystallization of CoFe. However, B in the finished magnetic tunnel junction construction undesirably reduces tunneling magnetoresistance (TMR) of the magnetic tunnel junction.

DETAILED DESCRIPTION OF EXAMPLE EMBODIMENTS

Figure 1:
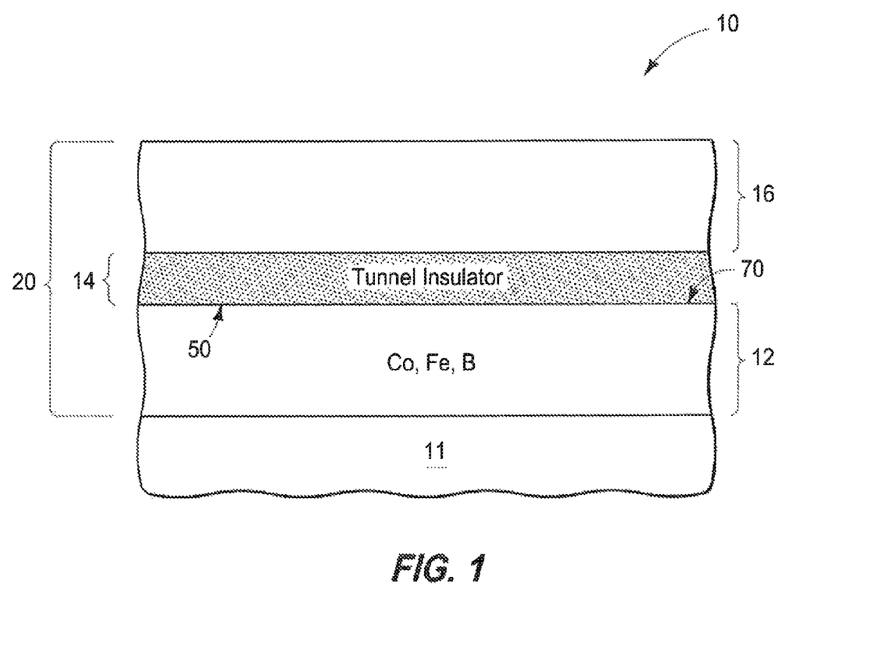
FIG. 1 is a diagrammatic sectional view of a substrate fragment in process in the fabrication of a magnetic tunnel junction in accordance with an embodiment of the invention.

Example methods of forming a magnetic tunnel junction in accordance with some embodiments of the invention are initially described with reference to FIGS. 1-5 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Referring to FIG. 1, substrate fragment 10 comprises a base or substrate 11 showing various materials having been formed as an elevational stack there-over. Materials may be aside, elevationally inward, or elevationally outward of the FIG. 1-depicted materials. For example, other partially or wholly fabricated components of integrated circuitry may be provided somewhere about or within fragment 10. Substrate 11 may comprise any one or more of conductive (i.e., electrically herein), semiconductive, or insulative/insulator (i.e., electrically herein) materials. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

First magnetic (i.e., ferrimagnetic or ferromagnetic herein) electrode material 12 (i.e., electrically conductive) is formed over substrate 11. In one embodiment, magnetic electrode material 12 comprises Co and Fe (e.g., an alloy comprising Co and Fe). In one embodiment, magnetic electrode material 12 is amorphous, and in one embodiment comprises B. Any suitable compositions may be used, with $Co_{40}Fe_{40}B_{20}$ being an example that includes B. Characterization of a material or region as being "amorphous" where used in this document requires at least 90% by volume of the stated material or region to be amorphous. Further, reference to "magnetic" herein does not require a stated magnetic material or region to be magnetic as initially formed, but does require some portion of the stated magnetic material or region to functionally be "magnetic" in a finished circuit construction of the magnetic tunnel junction. First electrode material 12 may contain non-magnetic insulator, semiconductive, and/or conductive material or regions. However, first material 12 is characterized as being overall and collectively magnetic and conductive even though it may have one or more regions therein that are intrinsically locally non-magnetic and/or non-conductive. First electrode material 12 may comprise, consist essentially of, or consist of Co, Fe, and B.

An example thickness for first electrode material 12 is about 10 Angstroms to about 500 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials and regions described herein may be of substantially constant thickness or of variable thicknesses. If of variable thickness, thickness refers to average thickness unless otherwise indicated. As used herein, "different composition" only requires those portions of two stated materials that may be directly against one another to be chemically and/or physically different, for example if such materials are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", and "against" not preceded by "directly" encompass "directly against" as well as construction where intervening material(s), region(s), or structure(s) result(s) in no physical touching contact of the stated materials, regions, or structures relative one another.

Non-magnetic tunnel insulator 14 comprising MgO is formed over first material 12. Tunnel insulator 14 may comprise, consist essentially of, or consist of MgO. An example thickness is about 50 Angstroms to about 200 Angstroms. In one embodiment, MgO of tunnel insulator material 14, Co, Fe, and B (of first material 12) are directly against one another.

Second magnetic electrode material 16 is formed over tunnel insulator material 14. Any aspect(s) or attribute(s) described above for first material 12 may apply with respect to second material 16. In one embodiment, at least one of first material 12 and second material 16 comprises Co, Fe, and B. In one embodiment, a stack 20 is formed that comprises amorphous first magnetic electrode material 12, non-magnetic tunnel insulator material 14 comprising MgO over first material 12, and amorphous second magnetic electrode material 16 over tunnel insulator material 14, and wherein at least one of first material 12 and second material 16 comprises Co, Fe, and B. The elevational positions of materials 12 and 16 may be reversed and/or an orientation other than an elevational stack may be used (e.g., lateral; diagonal; a combination of one or more of elevational, horizontal, diagonal; etc.). In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

In one embodiment where each of materials 12 and 16 are amorphous, such materials are crystallized into crystalline first magnetic electrode material 12 and crystalline second magnetic electrode material 16. Annealing substrate fragment 10 at about 350° C. in an inert atmosphere is an example technique for causing such crystallizing. Characterization of a material or region as being "crystalline" where used in this document requires at least 90% by volume of the stated material or region to be crystalline. Tunnel insulator material 14 ideally is also crystalline either initially as-formed or becomes so while crystallizing an amorphous first magnetic electrode material 12 and/or an amorphous second magnetic electrode material 16. One of crystalline first material 12 and crystalline second material 16 comprises magnetic reference material of the magnetic tunnel junction being formed. The other of crystalline first material 12 and crystalline second material 16 comprises magnetic recording material of a magnetic tunnel junction being formed.

Figure 2:
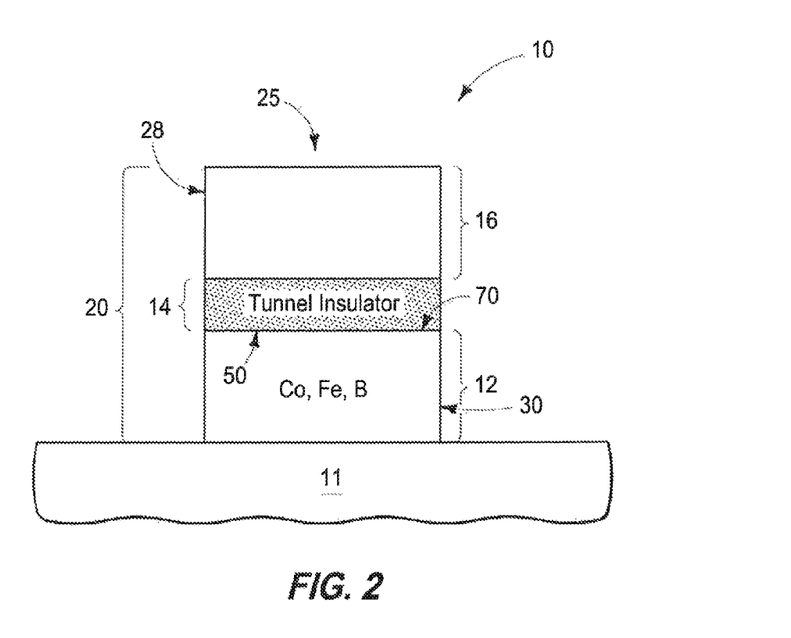
FIG. 2 is a view of the FIG. 1 substrate fragment at a processing step subsequent to that shown by FIG. 1.

Referring to FIG. 2, and in one embodiment, crystalline first material 12, tunnel insulator material 14, and crystalline second material 16 are patterned to form a magnetic tunnel junction structure or construction 25 having opposing sidewalls 28 and 30 that individually comprise crystalline first material 12, tunnel insulator material 14, and crystalline second material 16. Any existing or yet-to-be developed patterning technique(s) may be used. An example technique includes photolithographic masking and etch (e.g., with or without pitch multiplication). The above-described processing and patterning processes stack 20 to form opposing sidewalls 28 and 30 after the act of crystallizing materials 12, 14, and/or 16. Alternately, such or other patterning when used may be conducted to form sidewalls 28 and 30 before the act of crystallizing materials 12, 14, and/or 16.

Figure 3:
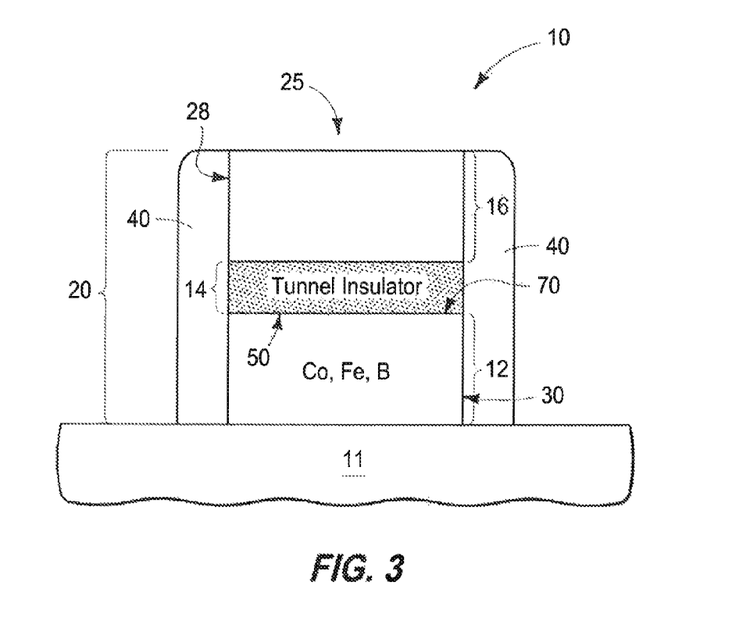
FIG. 3 is a view of the FIG. 2 substrate fragment at a processing step subsequent to that shown by FIG. 2.

Referring to FIG. 3, and in one embodiment, a B-absorbing material is formed over sidewalls 28, 30 of each of crystalline first electrode material 12, tunnel insulator material 14, and crystalline second magnetic electrode material 16. In one embodiment and as shown, all of each of sidewalls 28 and 30 is covered with B-absorbing material

40. An example technique of forming B-absorbing material is by a conformal deposition of material 40 followed by anisotropic etch thereof to largely remove material 40 from horizontal surfaces. In one embodiment, B-absorbing material 40 is formed to have a minimum lateral thickness of about 10 Angstroms to about 200 Angstroms, and in one embodiment a minimum lateral thickness of no more than about 100 Angstroms.

Figure 4:
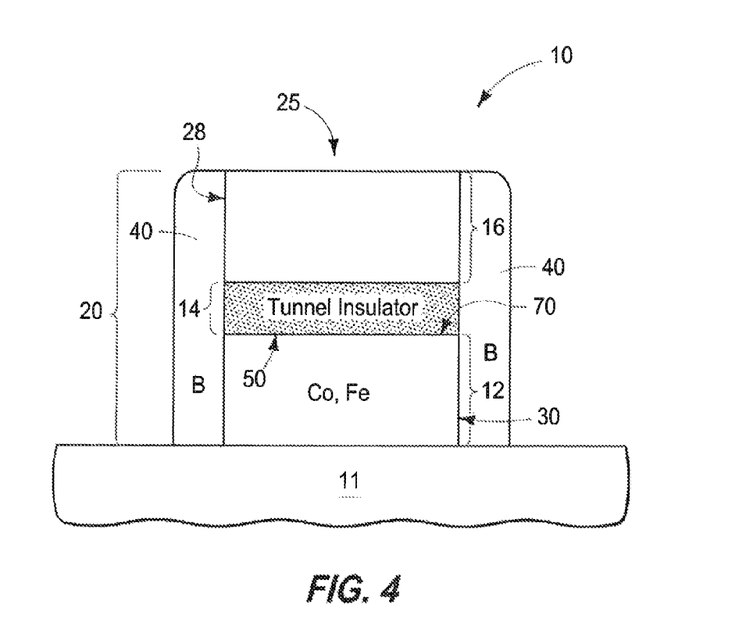
FIG. 4 is a view of the FIG. 3 substrate fragment at a processing step subsequent to that shown by FIG. 3, and in one embodiment is a view of a magnetic tunnel junction in accordance with an embodiment of the invention independent of method of manufacture.

Referring to FIG. 4, B is absorbed from the at least one of crystalline first material 12 or crystalline second material 16 that comprises Co, Fe, and B laterally into B-absorbing material 40 that is over sidewall 28 and over sidewall 30. A B-absorbing material is a material having a composition that has an affinity for B, thus an affinity to absorb B there-into. The absorbing of B may occur predominantly (i.e., more than 50% herein) during the forming of B-absorbing material 40 or predominantly thereafter. Regardless, in one embodiment, B-absorbing material 40 is annealed at a temperature of about 50° C. to about 450° C., for example which may facilitate the absorbing of B. Regardless, in one embodiment, at least some of the absorbed B chemically reacts with the B-absorbing material to form a reaction product comprising B. Alternately or additionally, none or some of the absorbed B may not so react.

In one embodiment, crystallization and B-absorption occurs after sidewalls of the stack are formed (e.g., after patterning the stack). In such embodiment, the B-absorbing material is formed over the opposing sidewalls of each of the amorphous first magnetic electrode material, the tunnel insulator material, and the amorphous second magnetic electrode material prior to crystallizing the amorphous first and second magnetic electrode materials into crystalline first and second magnetic electrode materials, with the act of crystallizing also absorbing B from the at least one of the first and second materials comprising Co, Fe, and B laterally into the B-absorbing material that is over the opposing sidewalls.

In one embodiment, the B-absorbing material is conductive at least after the absorbing, and in one embodiment before and after the absorbing. Example conductive B-absorbing materials comprise elemental-form metals or an alloy of two or more metal elements. Example metal elements comprise Al, Ta, and W. Such may react with absorbed B to form one or more conductive aluminum borides, tantalum borides, or tungsten borides, respectively.

In one embodiment, the B-absorbing material is semiconductive at least after the absorbing, and in one embodiment before and after the absorbing. An example semiconductive B-absorbing material is MN. By way of example, absorbed B in such material may form material 40 to comprise a semiconductive mixture of aluminum nitride and aluminum boride.

In one embodiment, the B-absorbing material is insulative at least after the absorbing of B, and in one embodiment before and after the absorbing of B. Example insulative B-absorbing materials comprise $Al_2O_3$, a combination of $SiO_2$ and $Al_2O_3$, and a combination of $Si_3N_4$ and MN (with sufficient $Si_3N_4$ in the composition to render it insulative as opposed to semiconductive due to presence of MN).

Figure 5:
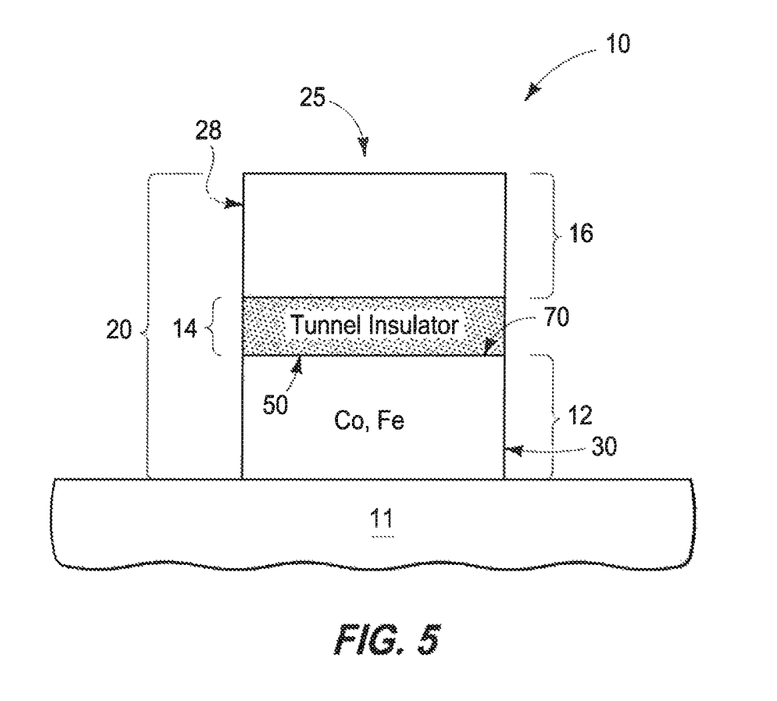
FIG. 5 is a view of the FIG. 4 substrate fragment at a processing step subsequent to that shown by FIG. 4.

In one embodiment, after absorbing the B, any remnant of the B-absorbing material, any remnant of any reaction product of B with the B-absorbing material, and the absorbed B are removed. This may be desirable, for example, where the B-absorbing material is conductive or semiconductive (at least after the absorbing) to preclude electrode materials 12 and 16 from being electrically shorted together in the finished circuitry construction. FIG. 5 by way of example shows such subsequent processing whereby B-absorbing material 40 (not shown) from FIG. 4 has been removed from the substrate (e.g., by selective etching). In one embodiment, for example where the B-absorbing material is insulative at least after the act of absorbing, the B-absorbing material, any remnant of any reaction product of B with the B-absorbing material, and the absorbed B are incorporated into a finished circuit construction encompassing the magnetic tunnel junction being formed.

In one embodiment, tunnel insulator 14 and magnetic electrode materials 12 and/or 16 from which the B was absorbed are devoid of B after the absorbing of B. In this document, "devoid of B" means 0 atomic % B to no more than 0.1 atomic % B.

An embodiment of the invention encompasses a method used while forming a magnetic tunnel junction. Such a method includes forming non-magnetic tunnel insulator material comprising MgO over magnetic electrode material (regardless of whether crystalline or amorphous) comprising Co and Fe (regardless of whether magnetic electrode material of more than one magnetic electrode of a magnetic tunnel junction is formed). B is proximate (i.e., within 100 Angstroms herein) opposing facing surfaces of the tunnel insulator material and the magnetic electrode material (i.e., regardless of whether B is in the magnetic electrode material and regardless of whether MgO, Co, Fe, and B are directly against one another). For example and by way of example only, FIGS. 1 and 2 show B being proximate opposing surfaces 50 and 70 of tunnel insulator material 14 and magnetic electrode material 12, respectively, a result of B being within or part of material 12. Alternately or additionally, by way of example, B may be within MgO regardless of whether B is within magnetic electrode material 12 and/or 16. Additionally, by way of example, some other B-containing material having minimum thickness no greater than 100 Angstroms (not specifically shown or designated) may be between magnetic electrode material 12 or 16 and tunnel dielectric 14, with such B therein thereby being proximate opposing facing surfaces of the tunnel insulator material and the magnetic electrode material. Regardless, B-absorbing material is formed over a sidewall (e.g., one or both of sidewalls 28, 30) of at least one of the magnetic electrode material and the tunnel insulator material. B that is proximate opposing surfaces 50, 70 is absorbed laterally into the B-absorbing material. Any other attribute(s) or aspect(s) as described above and/or shown in the Figures may be used.

Embodiments of the invention encompass a magnetic tunnel junction (i.e., a structure) independent of method of manufacture. Such a magnetic tunnel junction comprises a conductive first magnetic electrode comprising magnetic recording material and a conductive second magnetic electrode spaced from the first electrode and comprising magnetic reference material. A non-magnetic tunnel insulator material is between the first and second electrodes. At least one of the magnetic recording material and the magnetic reference material comprises Co and Fe. The tunnel insulator material comprises MgO. The first magnetic electrode, the second magnetic electrode, and the tunnel insulator material comprise a stack having opposing sidewalls. Insulative material is laterally proximate, in one embodiment directly against, the opposing stack sidewalls. The insulative material comprises B, at least one of Si and Al, and at least one of N and O.

In one embodiment, the insulative material comprises Al and in one embodiment comprises N. In one embodiment, the insulative material comprises Al and N. In one embodiment, the insulative material comprises O and in one embodiment comprises Al and O. In one embodiment, B is present in the insulative material at a concentration of at least about 10 atomic percent and in one embodiment at least about 20 atomic percent. Any other attribute(s) or aspect(s) as described above and/or shown in the Figures may be used in magnetic tunnel junction device embodiments.

The example embodiments of FIGS. 1-5 depict single magnetic tunnel junctions (SMTJs). However, dual magnetic tunnel junctions (DMTJs) or more than dual (two) magnetic tunnel junctions are contemplated.

CONCLUSION

In some embodiments, a method used while forming a magnetic tunnel junction comprises forming non-magnetic tunnel insulator material over magnetic electrode material. The tunnel insulator material comprises MgO and the magnetic electrode material comprises Co and Fe. B is proximate opposing facing surfaces of the tunnel insulator material and the magnetic electrode material. B-absorbing material is formed over a sidewall of at least one of the magnetic electrode material and the tunnel insulator material. B is absorbed from proximate the opposing facing surfaces laterally into the B-absorbing material.

In some embodiments, a method of forming a magnetic tunnel junction comprises forming a stack comprising amorphous first magnetic electrode material, non-magnetic tunnel insulator material comprising MgO over the first material, and amorphous second magnetic electrode material over the tunnel insulator material. At least one of the first and second materials comprises Co, Fe, and B. The amorphous first and second magnetic electrode materials are crystallized into crystalline first and second magnetic electrode materials. One of the crystalline first material and the crystalline second material comprises magnetic reference material of the magnetic tunnel junction being formed. The other of the crystalline first material and the crystalline second material comprises magnetic recording material of the magnetic tunnel junction being formed. After the crystallizing, B-absorbing material is formed over opposing sidewalls of each of the crystalline first magnetic electrode material, the tunnel insulator material, and the second magnetic electrode material. B is absorbed from said at least one of the crystalline first and second materials comprising Co, Fe, and B laterally into the B-absorbing material that is over said opposing sidewalls.

In some embodiments, a method of forming a magnetic tunnel junction comprises forming amorphous first magnetic electrode material over a substrate. The first material comprises Co, Fe, and B. Non-magnetic tunnel insulator material comprising MgO is formed over the first material. Amorphous second magnetic electrode material is formed over the tunnel insulator material, and comprises Co, Fe, and B. After forming the amorphous first and second magnetic electrode materials and the tunnel insulator material over the substrate, the amorphous first and second magnetic electrode materials are crystallized into crystalline first and second magnetic electrode materials. After the crystallizing, the crystalline first material, the tunnel insulator material, and the crystalline second material are patterned to form a magnetic tunnel junction structure having opposing sidewalls that individually comprise the crystalline first material, the tunnel insulator material, and the crystalline second material. One of the crystalline first material and the crystalline second material comprises magnetic reference material of the magnetic tunnel junction being formed. The other of the crystalline first material and the crystalline second material comprises magnetic recording material of the magnetic tunnel junction being formed. All of said opposing sidewalls are covered with B-absorbing material. B is absorbed from the first and second materials laterally into the B-absorbing material that covers all of said opposing sidewalls. At least some of the absorbed B is reacted with the B-absorbing material to form a reaction product comprising B.

In some embodiments, a magnetic tunnel junction comprises a conductive first magnetic electrode comprising magnetic recording material and a conductive second magnetic electrode spaced from the first electrode and comprising magnetic reference material. A non-magnetic tunnel insulator material is between the first and second electrodes. At least one of the magnetic recording material and the magnetic reference material comprises Co and Fe. The tunnel insulator material comprises MgO. The first magnetic electrode, the second magnetic electrode, and the tunnel insulator material comprise a stack having opposing sidewalls. Insulative material is laterally proximate the opposing stack sidewalls. Such insulative material comprises B, at least one of Si and Al, and at least one of N and O.

In some embodiments, a method of forming a magnetic tunnel junction comprises forming a stack comprising amorphous first magnetic electrode material, non-magnetic tunnel insulator material comprising MgO over the first material, and amorphous second magnetic electrode material over the tunnel insulator material. At least one of the first and second materials comprises Co, Fe, and B. B-absorbing material is formed over opposing sidewalls of each of the amorphous first magnetic electrode material, the tunnel insulator material, and the amorphous second magnetic electrode material. The amorphous first and second magnetic electrode materials are crystallized into crystalline first and second magnetic electrode materials. One of the crystalline first material and the crystalline second material comprises magnetic reference material of the magnetic tunnel junction being formed. The other of the crystalline first material and the crystalline second material comprises magnetic recording material of the magnetic tunnel junction being formed. The act of crystallizing also absorbs B from said at least one of the first and second materials comprising Co, Fe, and B laterally into the B-absorbing material that is over said opposing sidewalls.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used while forming a magnetic tunnel junction, comprising:
   forming non-magnetic tunnel insulator material over magnetic electrode material, the tunnel insulator material comprising MgO, the magnetic electrode material comprising Co and Fe, B being proximate opposing facing surfaces of the tunnel insulator material and the magnetic electrode material; and
   forming B-absorbing material over a sidewall of at least one of the magnetic electrode material and the tunnel insulator material and absorbing B from proximate the opposing facing surfaces laterally into the B-absorbing material, the B-absorbing material being conductive at least after the absorbing.

2. The method of claim 1 wherein the B-absorbing material comprises an elemental-form metal or an alloy of two or more metal elements.

3. The method of claim 2 wherein the metal comprises Al, Ta, or W.

4. The method of claim 2 wherein the B-absorbing material comprises an elemental-form metal.

5. The method of claim 4 wherein the elemental-form metal comprises Al.

6. The method of claim 4 wherein the elemental-form metal comprises Ta.

7. The method of claim 4 wherein the elemental-form metal comprises W.

8. The method of claim 2 wherein the B-absorbing material comprises an alloy of two or more metal elements.

9. A method used while forming a magnetic tunnel junction, comprising:
forming non-magnetic tunnel insulator material over magnetic electrode material, the tunnel insulator material comprising MgO, the magnetic electrode material comprising Co and Fe, B being proximate opposing facing surfaces of the tunnel insulator material and the magnetic electrode material; and
forming B-absorbing material over a sidewall of at least one of the magnetic electrode material and the tunnel insulator material and absorbing B from proximate the opposing facing surfaces laterally into the B-absorbing material, the B-absorbing material being semiconductive at least after the absorbing.

10. The method of claim 9 wherein the semiconductive B-absorbing material comprises AlN.

11. A method used while forming a magnetic tunnel junction, comprising:
forming non-magnetic tunnel insulator material over magnetic electrode material, the tunnel insulator material comprising MgO, the magnetic electrode material comprising Co and Fe, B being proximate opposing facing surfaces of the tunnel insulator material and the magnetic electrode material;
forming B-absorbing material over a sidewall of at least one of the magnetic electrode material and the tunnel insulator material and absorbing B from proximate the opposing facing surfaces laterally into the B-absorbing material; and
after absorbing the B, removing any remnant of the B-absorbing material, any remnant of any reaction product of B with the B-absorbing material, and the absorbed B.

12. A method used while forming a magnetic tunnel junction, comprising:
forming non-magnetic tunnel insulator material over magnetic electrode material, the tunnel insulator material comprising MgO, the magnetic electrode material comprising Co and Fe, B being proximate opposing facing surfaces of the tunnel insulator material and the magnetic electrode material; and
forming B-absorbing material over a sidewall of at least one of the magnetic electrode material and the tunnel insulator material and absorbing B from proximate the opposing facing surfaces laterally into the B-absorbing material, the opposing facing surfaces, the tunnel insulator, and the magnetic electrode material being devoid of B after the absorbing of B.

13. A method of forming a magnetic tunnel junction, comprising:
forming a stack comprising amorphous first magnetic electrode material, non-magnetic tunnel insulator material comprising MgO over the first material, and amorphous second magnetic electrode material over the tunnel insulator material; at least one of the first and second materials comprising Co, Fe, and B;
crystallizing the amorphous first and second magnetic electrode materials into crystalline first and second magnetic electrode materials, one of the crystalline first material and the crystalline second material comprising magnetic reference material of the magnetic tunnel junction being formed, the other of the crystalline first material and the crystalline second material comprising magnetic recording material of the magnetic tunnel junction being formed;
after the crystallizing, forming B-absorbing material over opposing sidewalls of each of the crystalline first magnetic electrode material, the tunnel insulator material, and the second magnetic electrode material;
absorbing B from said at least one of the crystalline first and second materials comprising Co, Fe, and B laterally into the B-absorbing material that is over said opposing sidewalls; and
wherein the B-absorbing material is conductive or semiconductive at least after the absorbing, and further comprising:
after absorbing the B, removing any remnant of the B-absorbing material, any remnant of any reaction product of B with the B-absorbing material, and the absorbed B.

14. A method of forming a magnetic tunnel junction, comprising:
forming amorphous first magnetic electrode material over a substrate, the first material comprising Co, Fe, and B;
forming non-magnetic tunnel insulator material comprising MgO over the first material;
forming amorphous second magnetic electrode material over the tunnel insulator material, the second material comprising Co, Fe, and B;
after forming the amorphous first and second magnetic electrode materials and the tunnel insulator material over the substrate, crystallizing the amorphous first and second magnetic electrode materials into crystalline first and second magnetic electrode materials;
after the crystallizing, patterning the crystalline first material, the tunnel insulator material, and the crystalline second material to form a magnetic tunnel junction structure having opposing sidewalls that individually comprise the crystalline first material, the tunnel insulator material, and the crystalline second material; one of the crystalline first material and the crystalline second material comprising magnetic reference material of the magnetic tunnel junction being formed; the other of the crystalline first material and the crystalline second material comprising magnetic recording material of the magnetic tunnel junction being formed;
covering all of said opposing sidewalls with B-absorbing material;
absorbing B from the first and second materials laterally into the B-absorbing material that covers all of said opposing sidewalls; and
reacting at least some of the absorbed B with the B-absorbing material to form a metal boride-comprising reaction product.

* * * * *